United States Patent
Sakuraba et al.

(10) Patent No.: US 11,889,762 B2
(45) Date of Patent: Jan. 30, 2024

(54) VERTICAL THERMOELECTRIC CONVERSION ELEMENT AND DEVICE WITH THERMOELECTRIC POWER GENERATION APPLICATION OR HEAT FLOW SENSOR USING SAME

(71) Applicant: NATIONAL INSTITUTE FOR MATERIALS SCIENCE, Tsukuba (JP)

(72) Inventors: Yuya Sakuraba, Tsukuba (JP); Weinan Zhou, Tsukuba (JP); Kenichi Uchida, Tsukuba (JP); Kaoru Yamamoto, Tsukuba (JP)

(73) Assignee: National Institute for Materials Science, Ibaraki (JP)

( * ) Notice: Subject to any disclaimer, the term of this patent is extended or adjusted under 35 U.S.C. 154(b) by 0 days.

(21) Appl. No.: 17/801,061

(22) PCT Filed: Mar. 12, 2021

(86) PCT No.: PCT/JP2021/009982
§ 371 (c)(1),
(2) Date: Aug. 19, 2022

(87) PCT Pub. No.: WO2021/187347
PCT Pub. Date: Sep. 23, 2021

(65) Prior Publication Data
US 2023/0102920 A1    Mar. 30, 2023

(30) Foreign Application Priority Data
Mar. 19, 2020 (JP) ................. 2020-049595

(51) Int. Cl.
*H10N 10/17* (2023.01)
*H10N 52/80* (2023.01)

(52) U.S. Cl.
CPC ............. *H10N 10/17* (2023.02); *H10N 52/80* (2023.02)

(58) Field of Classification Search
CPC ....... H10N 15/00–20; H10N 52/00–85; H10N 10/00–857
See application file for complete search history.

(56) References Cited

U.S. PATENT DOCUMENTS

2011/0226304 A1 * 9/2011 Hayashi ................. H10N 10/17
                                                                136/238

FOREIGN PATENT DOCUMENTS

| JP | 2001168403 A | * | 6/2001 |
| JP | 2003060244 A | * | 2/2003 |
| JP | 2008147304 A | * | 6/2008 |

(Continued)

OTHER PUBLICATIONS

Andrew F. May and Brian C. Sales, "Twisting the thermoelectric potential", Nature Materials 20, p. 447-453 (Published online Jan. 18, 2021) (Year: 2021).*
Machine translation of JP2020/098860A (Year: 2020).*
Machine translation of JP2003/060244A (Year: 2003).*
Machine translation of JP2001/168403A (Year: 2001).*
Machine translation of JP2008147304A (Year: 2008).*

(Continued)

*Primary Examiner* — Ryan S Cannon
(74) *Attorney, Agent, or Firm* — Morgan, Lewis & Bockius LLP (57) ABSTRACT

The present disclosure provides: a magnetoresistive element having a large magnetoresistance change ratio (MR ratio); and a magnetic sensor, a reproducing head and a magnetic recording and reproducing device.

7 Claims, 4 Drawing Sheets

(56) References Cited

FOREIGN PATENT DOCUMENTS

JP          6079995 B1        2/2017
JP       2020098860 A    *   6/2020

OTHER PUBLICATIONS

Sakai et al. al., "Giant anomalous Nernst effect and quantum-critical scaling in a ferromagnetic semimetal", Nature Physics, 14 1119 (2018).

Nakayama et al., "Mechanism of strong enhancement of anomalous Nernst effect in Fe by Ga substitution", Phys. Rev. Mat. 3, 114412 (2019).

Miura et al., "Observation of anomalous Ettingshausen effect and large transverse thermoelectric conductivity in permanent magnets", Appl. Phys. Lett. 115, 222403 (2019).

Sakuraba, "Potential of thermoelectric power generation using anomalous Nernst effect in magnetic materials", Scripta Materialia 111, 29-32 (2016).

Snyder et al., "Complex thermoelectric materials", Nature Materials (2008), 7, 105-114.

Sootsman et al., "New and Old Concepts in Thermoelectric Materials", Angew. Chem. Int. Ed. (2009), 48, 8616-8639.

Zhou et al., "Seebeck-driven transverse thermoelectric generation", Nature Materials (2021), 20, 463-467.

International Search Report (with partial translation) dated Jun. 8, 2021, issued in corresponding International Patent Application No. PCT/JP2021/009982.

* cited by examiner

VERTICAL THERMOELECTRIC CONVERSION ELEMENT AND DEVICE WITH THERMOELECTRIC POWER GENERATION APPLICATION OR HEAT FLOW SENSOR USING SAME

TECHNICAL FIELD

The present invention relates to a vertical thermoelectric conversion element, and a device with thermoelectric power generation application or a heat flow sensor using the same.

BACKGROUND ART

The anomalous Nernst effect in a magnetic body is a phenomenon that generates an electric field in vector product direction ($\nabla T \times M$) of magnetization M and temperature gradient $\nabla T$. When this is used, since a simple in-plane connection type structure series voltage can be increased, a thermoelectric power generation application and application to a heat flow sensor can be expected (See FIG. 7 and Patent Literature 1).

However, the thermopower of the anomalous Nernst effect (anomalous Nernst coefficient) reported so far for various magnetic materials is 6 µV/K for $Co_2MnGa$ Heusler's alloy (Non-Patent Literature 1), 2.1 µV/K for FeGa alloy (Non-Patent Literature 2), and 3.1 to 3.6 µV/K for $SmCo_5$ permanent magnet (Non-Patent Literature 3), even if it is large, and when compared with the thermopower of the Seebeck effect (Seebeck coefficient) of the material used for Seebeck thermoelectric power generation being about several 100 µV/K, the value remains small by about 2 orders of magnitude. The thermoelectric materials are comprehensively described in Non-Patent Literatures 5 and 6, for example.

For the above application, development of a magnetic material having high thermopower by the Nernst effect is required, and realization of 20 µV/K is required in Non-Patent Literature 4.

CITATION LIST

Patent Literature

PATENT LITERATURE 1: JP 6079995 B

Non-Patent Literature

NON-PATENT LITERATURE 1: Sakai et al., Nature Physics, 14 1119 (2018)
NON-PATENT LITERATURE 2: Nakayama et al., Phys. Rev. Mat. 3, 114412 (2019)
NON-PATENT LITERATURE 3: Miura et al., Appl. Phys. Lett. 115, 222403 (2019)
NON-PATENT LITERATURE 4: Sakuraba, Scripta Materialia 111, 29-32 (2016)
NON-PATENT LITERATURE 5: Snyder, G. J. and Toberer, E. S. Nature Materials 2008, 7, 105.
NON-PATENT LITERATURE 6: Sootsman, J. R.; Chung, D. Y.; Kanatzidis, M. G. Angew. Chem. Int. Ed. 2009, 48, 8616.

SUMMARY OF INVENTION

Technical Problems

For thermoelectric power generation applications and heat flow sensor applications, it has been conventionally aimed to realize thermopower due to the high anomalous Nernst effect as an essential characteristic of a magnetic material alone. However, the thermopower achieved at the present time remains at about 6 µV/K at the maximum.

The present invention solves the problem, and an object of the present invention is to provide a vertical thermoelectric conversion element having a novel structure capable of enhancing thermopower exhibiting symmetry similar to the anomalous Nernst effect while maintaining thermoelectric conversion characteristics of a magnetic material. Another object of the present invention is to provide a novel device with thermoelectric power generation application or heat flow sensor using the vertical thermoelectric conversion element.

Solution to Problems

The present inventors propose a structure of a novel vertical thermoelectric conversion element capable of enhancing thermopower exhibiting symmetry similar to the anomalous Nernst effect without essentially improving thermoelectric conversion characteristics of a magnetic material.

Figure 1:
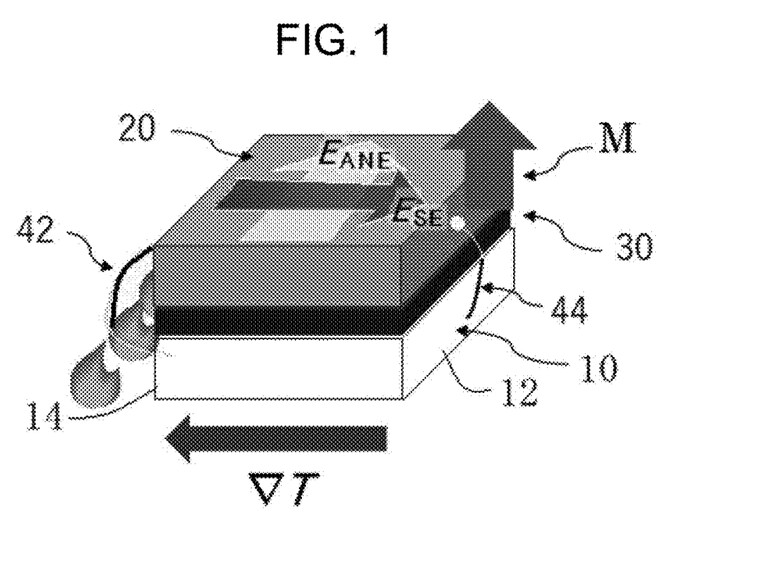
FIG. 1 is a configuration perspective view of a vertical thermoelectric conversion element showing one embodiment of the present invention.
Figure 2:
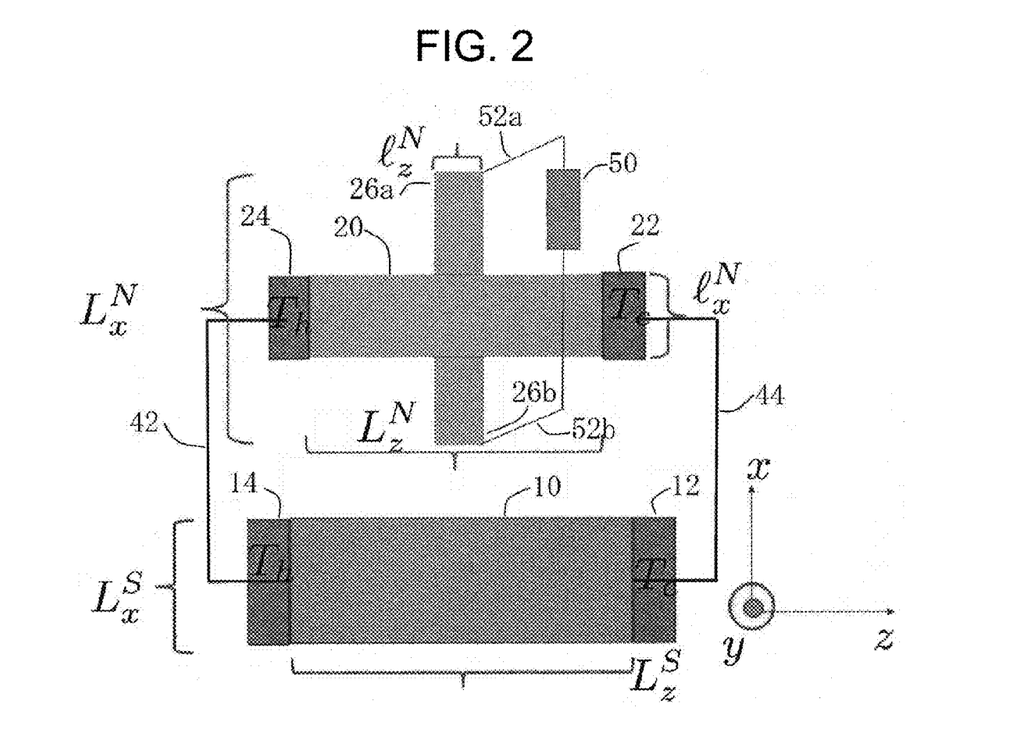
FIG. 2 is a model diagram of a Nernst voltage by a Seebeck assist effect.

[1] As illustrated in FIG. 1 and FIG. 2, for example, the vertical thermoelectric conversion element of the present invention includes thermoelectric layer 10 made of a thermoelectric material exhibiting a Seebeck effect, wherein one end portion of thermoelectric layer 10 is on a low temperature side, and other end portion 14 opposed to low-temperature-side end portion 12 on a high temperature side; magnetic body layer 20 stacked on thermoelectric layer 10, wherein magnetic layer 20 has conductivity and generates a potential in the vector product direction of the temperature gradient direction and the magnetization direction of magnetic layer 20 when magnetization or an external magnetic field is applied in the thickness direction of magnetic body layer 20; low-temperature-side conductor part 44 connecting low-temperature-side end portion 12 of thermoelectric layer 10 and low-temperature-side end portion 22 of magnetic body layer 20; high-temperature-side conductor part 42 connecting high-temperature-side end portion 24 of thermoelectric layer 10 and high-temperature-side end portion 14 of magnetic body layer 20; and output terminals (26a, 26b) provided at both end portions of magnetic body layer 20 in the vector product direction, which are in the vector product direction of temperature gradient direction ($\nabla T$) of thermoelectric layer 10 and magnetization direction (M) of magnetic body layer 20, for extracting a potential generated in the vector product direction.

[2] The vertical thermoelectric conversion element of the present invention may preferably further comprise electrically insulating layer 30 having thermal conductivity provided in the stacking direction between thermoelectric layer 10 and magnetic body layer 20.

[3] In the vertical thermoelectric conversion element of the present invention, electrically insulating layer 30 having thermal conductivity may preferably contains one kind or two or more kinds of an oxide selected from $SiO_2$ and $Al_2O_3$ or a nitride selected from AlN and BN.

[4] In the vertical thermoelectric conversion element of the present invention, thermoelectric layer 10 may preferably include at least one kind of thermoelectric material selected from the group of thermoelectric materials including $Bi_2Te_3$, PbTe, Si, Ge, an Fe—Si alloy, a Cr—Si alloy, an Mg—Si alloy, a $CoSb_3$ alloy, an $Fe_2VAl$-based Heusler's alloy, $SrTiO_3$, and the like.

[5] In the vertical thermoelectric conversion element of the present invention, preferably, magnetic body layer 20 may be a magnetic material having conductivity and include a magnetic material having an anomalous Hall angle of 1% or more and having spontaneous magnetization up to 100° C. or more.

[6] In the vertical thermoelectric conversion element of the present invention, the magnetic material having an anomalous Hall angle of 1% or more and spontaneous magnetization up to 100° C. or more may preferably include at least one kind of a magnetic material selected from the following groups (A) to (H).

(A) at least one kind or two or more kinds of $L1_0$-type ordered alloys selected from the group consisting of FePt, CoPt, FePd, CoPd, FeNi, MnAl, and MnGa, (B) at least one kind or two or more kinds of Heusler's alloys selected from the group consisting of $Co_2MnGa$ and $Co_2MnAl$, (C) at least one kind or two or more kinds of $D0_{22}$-type ordered alloys selected from the group consisting of $Mn_3Ga$, $Mn_2FeGa$, $Mn_2CoGa$, and $Mn_2RuGa$, (D) at least one or two or more kinds of binary disordered alloys selected from the group consisting of FeCr, FeAl, FeGa, FeSi, FeTa, FeIr, FePt, FeSn, FeSm, FeTb, CoFeB, CoTb, and NiPt, (E) at least one or two or more kinds of permanent magnet materials selected from the group consisting of an $SmCo_5$ magnet, an $Sm_2Co_{17}$ magnet, and an $Nd_2Fe_{14}B$ magnet;

(F) at least one kind or two or more kinds of multilayer film materials selected from the group consisting of stacks of Co/Pt and Co/Pd;

(G) at least one kind or two or more kinds of perovskite-type nitride materials selected from the group consisting of $Mn_4N$ and $Fe_4N$;

(H) at least one kind or two or more kinds of $D0_{19}$-type ordered alloys selected from the group consisting of $Mn_3Ga$, $Mn_3Ge$, and $Mn_3Sn$.

[7] The device with thermoelectric power generation application or the heat flow sensor of the present invention may use the vertical thermoelectric conversion element according to any one of [1] to [6].

Advantageous Effects of Invention

According to the vertical thermoelectric conversion element of the present invention, in the magnetic material forming the magnetic body layer, in addition to the anomalous Nernst effect generated by the magnetic material alone, the anomalous Hall effect generated with respect to the Seebeck current is superimposed, and a net anomalous Nernst thermoelectromotive force increasing effect is generated, so that high thermopower can be obtained. In other words, the thermoelectromotive force exhibiting symmetry similar to that of the anomalous Nernst effect is generated by assistance of the Seebeck effect and the anomalous Hall effect, and a vertical thermoelectric conversion element exhibiting high thermopower is obtained.

DESCRIPTION OF EMBODIMENTS

Hereinafter, the present invention is described with reference to the drawings.

FIG. 1 is a configuration perspective view of a vertical thermoelectric conversion element showing one embodiment of the present invention. In the figure, the vertical thermoelectric conversion element of the present invention has a three-layer structure of thermoelectric layer 10, magnetic body layer 20, and electrically insulating layer 30, and includes high-temperature-side conductor part 42, low-temperature-side conductor part 44, and output terminals 26a and 26b. $E_{ANE}$ indicates the anomalous Nernst effect voltage, $E_{SE}$ indicates the Seebeck effect voltage, M indicates the magnetization direction, ∇T indicates the direction of the temperature gradient from the low temperature side to the high temperature side.

Thermoelectric layer 10 is composed of a thermoelectric material having a Seebeck effect, one end portion of thermoelectric layer 10 is low-temperature-side end portion 12, and the other end portion opposed to low-temperature-side end portion 12 is high-temperature-side end portion 14. For examples, the thermoelectric material having the Seebeck effect can include $Bi_2Te_3$, PbTe, Si, Ge, a FeSi alloy, a CrSi alloy, a MgSi alloy, a $CoSb_3$ alloy, a $Fe_2VAl$-based Heusler's alloy, and $SrTiO_3$. Known thermoelectric materials are exhaustively listed in Non-Patent Literatures 5 and 6, and the description is incorporated as a list of the thermoelectric materials. For the heating of high-temperature-side end portion 14, for example, electrothermal heating, exhaust heat steam of a boiler device, or high-temperature drainage can be used. For cooling low-temperature-side end portion 12, for example, air cooling or water cooling may be used, and a solid heat dissipation member may be attached.

Magnetic body layer 20 is magnetic body layer 20 stacked on thermoelectric layer 10 and has conductivity and generates a potential in the vector product direction of temperature gradient direction ∇T and magnetization direction M of magnetic layer 20 when magnetization or an external magnetic field is applied in the film thickness direction of magnetic body layer 20. Magnetic body layer 20 is preferably to include a magnetic material that is a magnetic body having conductivity and having an anomalous Hall angle of 1% or more. In the case of a magnetic body, both the anomalous Nernst effect and the anomalous Hall effect are exhibited, but in order to obtain a large assist effect, it is preferable to select a magnetic material exhibiting a large anomalous Hall effect (anomalous Hall angle).

Here, the anomalous Hall angle is a parameter indicating how much the current is bent in the lateral direction when the current flows through the magnetic body. When the anomalous Hall angle is less than 1%, the potential generated in the vector product direction of temperature gradient direction ∇T and magnetization direction M of magnetic body layer 20 is low, which is not preferable for the vertical thermoelectric conversion element. Further, since it is necessary to have spontaneous magnetization at room temperature or higher in practical use, it is preferable to have spontaneous magnetization up to 100° C. or more.

As such the magnetic material having an anomalous Hall angle of 1% or more and spontaneous magnetization up to 100° C. or more, there is at least one kind of magnetic material selected from the group consisting of an $L1_0$-type ordered alloy, a Heusler's alloy, an iron-based alloy, and a permanent magnet material. That is, for example, the $L1_0$-type ordered alloy includes FePt, CoPt, FePd, CoPd, FeNi, MnAl, and MnGa. For example, the Heusler's alloy includes $Co_2MnGa$ and $Co_2MnAl$. For example, the $D0_{22}$-type ordered alloy includes $Mn_3Ga$, $Mn_2FeGa$, $Mn_2CoGa$, and $Mn_2RuGa$. For example, the binary disordered alloy includes FeCr, FeAl, FeGa, FeSi, FeTa, FeIr, FePt, FeSn, FeSm, FeTb, CoFeB, CoTb, and NiPt. For example, the permanent magnet material includes an $SmCo_5$ magnet, an $Sm_2Co_{17}$ magnet, and an $Nd_2Fe_{14}B$ magnet. For example, the multilayer film magnetic material includes Co/Pt and Co/Pd. For example, the perovskite-type nitride material includes $Mn_4N$ and $Fe_4N$. For example, the $D0_{19}$-type ordered alloy includes $Mn_3Ga$, $Mn_3Ge$, and $Mn_3Sn$.

Output terminals 26a and 26b are output terminals provided at both end portions in the vector product direction of magnetic body layer 20, which is the vector product direction of temperature gradient direction ∇T of thermoelectric layer 10 and magnetization direction M of magnetic body layer 20, for extracting a potential generated in the vector product direction.

Electrically insulating layer 30 is an electrically insulating layer having thermal conductivity provided between thermoelectric layer 10 and magnetic body layer 20 in the stacking direction. As the electrically insulating layer, for example, a layer containing one kind or two or more kinds of oxides such as $SiO_2$ and $Al_2O_3$ or nitrides such as AlN and BN can be used.

High-temperature-side conductor part 42 connects high-temperature-side end portion 14 of the thermoelectric layer 10 and high-temperature-side end portion 24 of the magnetic body layer 20, and for example, a conductor wire made of metal having low electric resistance such as a copper wire can be used. Low-temperature-side conductor part 44 connects low-temperature-side end portion 12 of thermoelectric layer 10 and low-temperature-side end portion 22 of magnetic body layer 20, and for example, a conductor wire made of metal having low electric resistance such as a copper wire can be used.

When thermoelectric layer 10 has substantially the same conductivity as an insulator such as an oxide, electrically insulating layer 30 may be omitted. In this case, in the structure in which insulating layer 30 is not placed on the high temperature side and the low temperature side, high-temperature-side conductor part 42 and low-temperature-side conductor part 44 are unnecessary.

The operation of the vertical thermoelectric conversion element configured as described above is described.

Thermoelectric layer 10 and magnetic body layer 20 are stacked via electrically insulating layer 30, and Seebeck thermoelectromotive force $E_{SE}$ due to thermoelectric material forming thermoelectric layer 10 is generated by temperature gradient ∇T of low-temperature-side end portion 12 and high-temperature-side end portion 14 of thermoelectric layer 10. Since magnetic body layer 20 is in thermal contact with thermoelectric layer 10 via electrically insulating layer 30, temperature gradient ∇T occurs between low-temperature-side end portion 22 and high-temperature-side end portion 24 of magnetic body layer 20. Since an external magnetic field is applied to magnetic material layer 20 in the film thickness direction, or magnetic material layer 20 is magnetized with the film thickness direction as magnetization direction M due to the magnetic anisotropy of magnetic material 20 itself, a potential is generated in the vector product direction of temperature gradient direction ∇T and magnetization direction M of magnetic body layer 20 by the anomalous Nernst effect.

In thermoelectric layer 10 and magnetic body layer 20, high-temperature-side end portion 14 of thermoelectric layer 10 and high-temperature side end 24 of magnetic body layer 20 are connected by high-temperature-side conductor part 42, and low-temperature-side end portion 12 of thermoelectric layer 10 and low-temperature side end 22 of magnetic body layer 20 are connected by low-temperature-side conductor part 44, so that an electrical closed circuit is formed. Under the temperature gradient, a Seebeck current flows in the magnetic material of magnetic body layer 20 due to a large thermoelectromotive force of the Seebeck thermoelectric material. As a result, in magnetic body layer 20, the anomalous Hall effect is driven by the Seebeck current.

In this way, in order to thermally arrange the Seebeck thermoelectric material and the magnetic material that develop a large Seebeck thermoelectromotive force in parallel and to electrically insulate the Seebeck thermoelectric material and the magnetic material from each other, a structure is adopted in which the Seebeck thermoelectric material and the magnetic material are physically separated or an insulator is sandwiched therebetween. From this state, when only the high temperature side and the low temperature side of each of the Seebeck thermoelectric material and the magnetic material are electrically connected to form an electrically closed circuit, in the magnetic material forming the magnetic body layer, in addition to the anomalous Nernst effect generated by the magnetic material alone, the anomalous Hall effect generated with respect to the Seebeck current is superimposed, so that thermoelectromotive force is generated in the same direction as the anomalous Nernst thermoelectromotive force. Therefore, high thermopower can be obtained by the sum of these contributions.

Subsequently, the thermopower by the vertical thermoelectric conversion element of the present invention is calculated.

FIG. 2 is a model diagram of a Nernst voltage by a Seebeck assist effect. Low-temperature-side end portion 12 ($T_L$) and high-temperature-side end portion 14 ($T_H$) are located at both ends of thermoelectric layer 10. $L_x^S$ is a length (width) in the x-axis direction (width direction) of Seebeck thermoelectric material S. $L_z^S$ is a length in the z-axis direction (longitudinal direction/Seebeck effect voltage direction) of Seebeck thermoelectric material S. $L_y^S$ is a length (thickness) in the y-axis direction (film thickness direction) of Seebeck thermoelectric material S.

Low-temperature-side end portion 22 ($T_L$) and high-temperature-side end portion 24 ($T_H$) are located at both ends of the member of magnetic body layer 20 in the direction parallel to thermoelectric layer 10. $l_x^N$ is the length (width) in the x-axis direction (width direction) of the member of magnetic material N in the direction parallel to thermoelectric layer 10. $L_z^N$ is the length in the z-axis direction (longitudinal direction) of the member of magnetic material N in the direction parallel to thermoelectric layer 10. $L_y^N$ is the length (thickness) in the y-axis direction (film thickness direction/magnetization direction) of magnetic material N.

Voltage output terminals 26a and 26b are located at both ends of the member of magnetic body layer 20 in the direction orthogonal to thermoelectric layer 10. $L_x^N$ is the length (width) in the x-axis direction (width direction/ anomalous Nernst effect voltage direction) of the member of magnetic material N in the direction orthogonal to thermoelectric layer 10. $l_z^N$ is the length in the z-axis direction (longitudinal direction) of the member of magnetic material N in the direction orthogonal to thermoelectric layer 10.

In order to quantitatively estimate the thermopower by the vertical thermoelectric conversion element of the present invention, the following formula can be formulated corresponding to the model illustrated in FIG. 2.

$$E = \rho j + S \nabla T + \rho_{AHE} m \times j - S_{ANE} m \times \nabla T \quad \text{[Mathematical formula 1]}$$

E: Electric field (vector)
j: Current density (vector)
ρ: Resistivity
S: Seebeck coefficient
$\rho_{AHE}$: anomalous Hall coefficient
$S_{ANE}$: anomalous Nernst coefficient
m: Unit magnetization vector
T: Temperature Here, the anomalous Hall effect means that the Hall resistivity increases in proportion to the external magnetic field in the normal Hall effect, but a huge Hall resistivity appears in the ferromagnetic metal in response to a change in magnetization. Empirically, Hall resistivity p is expressed by the following equation with respect to external magnetic field H and magnetization M.

$$\rho = R_H H + 4\pi R_{AHE} M \quad \text{[Mathematical formula 2]}$$

Here, $R_H$ is a normal Hall coefficient, and $R_{AHE}$ is an anomalous Hall coefficient. Anomalous Hall coefficient $R_{AHE}$ is about 10 to 1000 times larger than normal Hall coefficient $R_H$.

$$\left(\frac{E_x^N}{-\nabla T}\right) = S_{ANE} + \rho_{AHE} \frac{S^N - S^S}{\frac{L_y^N}{L_y^S}\rho^S + \rho^N} \quad \text{[Mathematical formula 3]}$$

Here, $S^S$ is the Seebeck coefficient of Seebeck thermoelectric material S, $S^N$ is the Seebeck coefficient of magnetic material N, $S_{ANE}$ is the anomalous Nernst coefficient, $\rho_{AHE}$ is the anomalous Hall effect coefficient, $\rho^S$ is the electrical resistivity of Seebeck thermoelectric material S, and $\rho^N$ is the electrical resistivity of magnetic material N. $E_x^N$ is electric field E in the x-axis direction (film thickness direction/magnetization direction) of magnetic material N.

The second term on the right side of the above equation is a Nernst (Hall) voltage by Seebeck assist, and the larger the absolute value of the second term on the right side is, the larger the assist effect is. Anomalous Hall resistivity $\rho_{AHE}$ in the second term on the right side indicates that the assist effect is large when anomalous Hall resistivity $\rho_{AHE}$ is large. In denominator of the second term on right side $$\left(\frac{L_y^N}{L_y^S}\right)\rho^S \quad \text{[Mathematical formula 4]}$$

indicates that when the electrical resistivity of Seebeck thermoelectric material S is small and the film thickness ratio with respect to magnetic material N is large, the assist effect is large. In a case where the sign of Seebeck coefficient $S^S$ of Seebeck thermoelectric material S and the sign of Seebeck coefficient S N of magnetic material N are different signs, $S^S$ in the second term on the right side indicates that the assist effect is large when the absolute value of $S^S$ is large. In addition, in a case where $S^S$ and $S^N$ are the same sign, when the absolute value of $S^S$ is larger than twice the absolute value of $S^N$, it indicates that the assist effect is large when the absolute value of $S^S$ is large.

Figure 3:
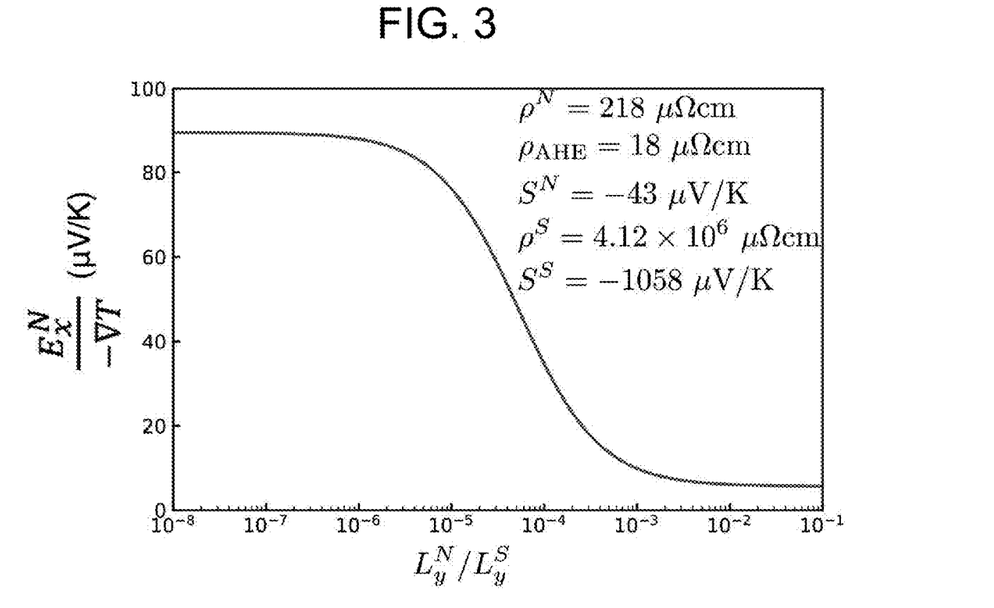
FIG. 3 is a calculated value diagram of Nernst thermoelectromotive force using $Co_2MnGa$ as an example.

That is, it can be seen that the conditions under which the assist effect by Seebeck thermoelectric material S increases are a case where the film thickness ratio of the thermoelectric material to the magnetic material is small, the Seebeck electromotive force of the thermoelectric material is large and the electrical resistivity is low, and the anomalous Hall angle of the magnetic material is large. FIG. 3 illustrates a calculation result obtained by substituting each physical property parameter in this model when $Co_2MnGa$ is used as the magnetic material and an n-type Si substrate is used as the thermoelectric material. As the film thickness ratio of $Co_2MnGa$ to Si decreases, the assist effect increases, and a Nernst electromotive force of 90 µV/K at the maximum is realized, as shown by the phenological calculation.

Example

Examples

As an example for demonstrating the present invention, a Heusler's alloy magnetic thin film $Co_2MnGa$ was formed on three substrates of n-type doped, p-type doped, and non-doped, and a verification experiment was conducted.

Figure 4:
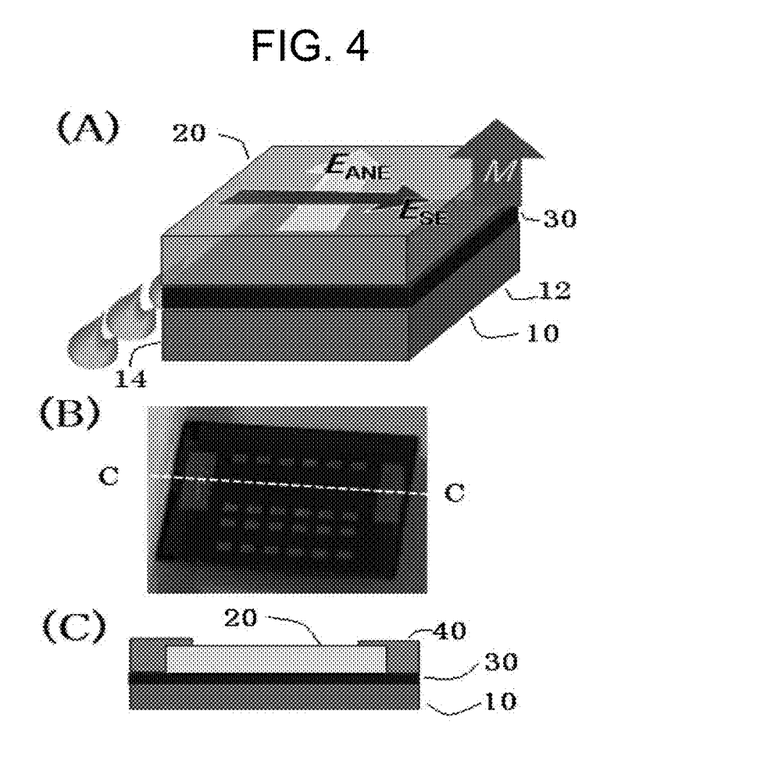
FIG. 4 is configuration diagram illustrating a vertical thermoelectric conversion element showing an embodiment of the present invention, in which (A) is a configuration perspective view before connection, (B) is a photograph showing a plane of the vertical thermoelectric conversion element, and (C) is a cross-sectional view taken along the line C-C of (B), and shows a state in which a thermoelectric layer and a magnetic body layer are insulated by an insulating layer.

In the first manufacturing process, as shown in FIG. 4, a thermally oxidized SiO insulating film having a thickness of 100 nm was formed on the surfaces of all the substrates. Usually, the $Co_2MnGa$ thin film and the Si substrate are electrically insulated.

Figure 5:
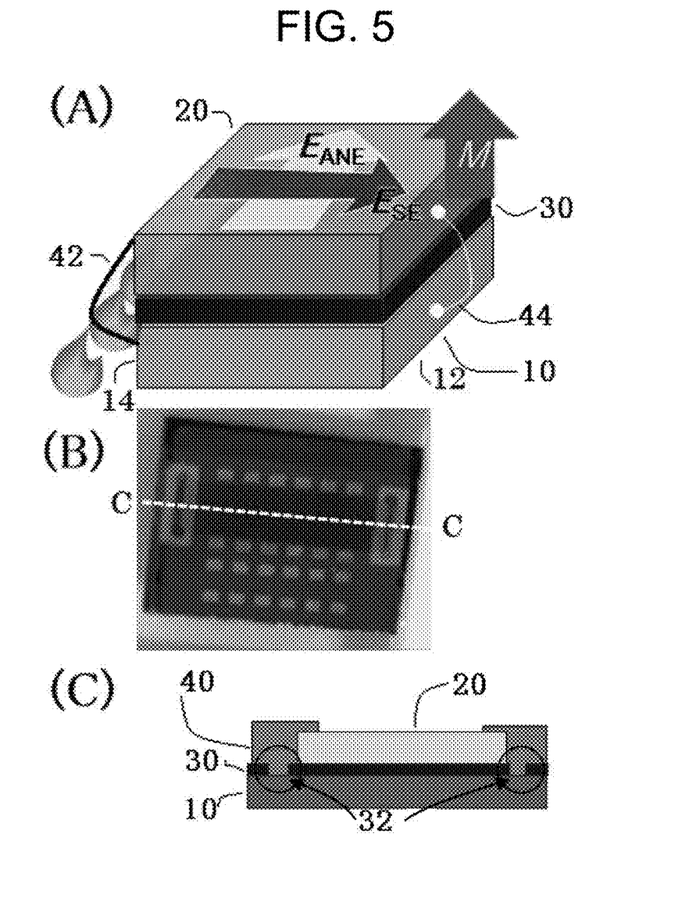
FIG. 5 is configuration diagram illustrating a vertical thermoelectric conversion element showing an embodiment of the present invention, in which (A) is a configuration perspective view after connection, (B) is a photograph showing a plane of the vertical thermoelectric conversion element, and (C) is a cross-sectional view taken along the line C-C of (B), and shows a state in which an insulating layer is cut off by a laser processing machine.

In the next manufacturing process, as shown in FIG. 5, insulating films near both left and right ends of the $Co_2MnGa$ thin film were removed by a laser, metal electrodes were attached to the portions, and the $Co_2MnGa$ thin film and the Si substrate were electrically connected at both ends to form a closed circuit.

In this example, a total of six kinds of samples of [two kinds×three kinds of substrates] with and without laser removal were evaluated. The Seebeck effect and anomalous Nernst effect were measured by flowing a heat flow in the plane of the substrate. The experimental results are shown in Table 1.

TABLE 1

| | Si substrate | | | | | |
|---|---|---|---|---|---|---|
| | P-type Si (Resistance value: 1~10 Ω · cm) (Seebeck coefficient $S_s$~ 1308 mV/K) | | N-type Si (Resistance value: 1~10 Ω · cm) (Seebeck coefficient $S_s$~ -1058 mV/K) | | Non-doped Si (Resistance value: 1000 Ω · cm or more) | |
| Co$_2$MnGa film thickness 50 nm | Without assist | With assist | Without assist | With assist | Without assist | With assist |
| ρ(mΩcm) | 331 | | 329 | | 336 | |
| ρ$_{yx}$(mΩcm) | 15.3 | | 15.2 | | 14.5 | |
| θ$_{AHE}$ = (ρ$_{yx}$/ρ) (%) | 4.6% | | 4.6% | | 4.3% | |
| Seebeck coefficient (mV/K) | -20.1 | 14.3 | -21.0 | -161.6 | -17.1 | -28.2 |
| Nernst coefficient (mV/K) | 2.43 | 0.94 -14.1 (Calculated value by model) | 2.44 | 7.94 23.7 (Calculated value by model) | 2.04 | 2.44 — |

When the Seebeck effect was measured, it was confirmed that in the sample electrically connected to Si, the Seebeck voltage of the Co$_2$MnGa thin film changed due to the influence of the Seebeck effect of the substrate. In the n-type Si substrate, the voltage is about −20 μV/K without removal of the insulating film by laser, but when a closed circuit was formed, a Seebeck effect of −160 μV/K appeared. In addition, it was confirmed that when the anomalous Nernst effect was measured, in the sample using the n-type Si substrate, the thermoelectromotive force was about +2.4 μV/K in the case of the magnetic film alone, but the thermoelectromotive force was increased 3 times or more to +7.9 μV/K in the case of being electrically connected to the Si substrate. This output increase is smaller than the prediction+23.7 μV/K by the above model calculation, but is an experimental result demonstrating the effect of the present invention.

Figure 6:
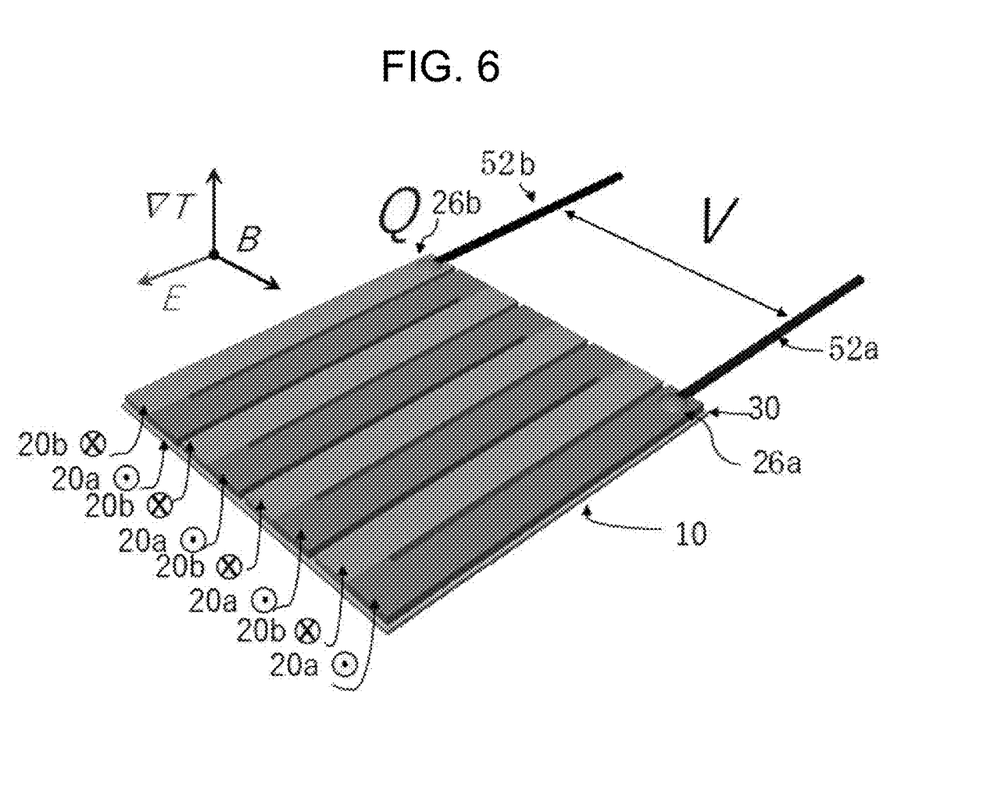
FIG. 6 is a configuration perspective view showing a basic structure of a thermoelectric power generation/heat flow sensor using the anomalous Nernst effect showing an embodiment of the present invention.

FIG. 6 is a configuration perspective view illustrating an example of an application element to a thermoelectric power generation application or a heat flow sensor using the vertical thermoelectric conversion element of the present invention.

As illustrated in FIG. 6, a series voltage can be amplified by a simple in-plane connection type thermopile structure.

In the Examples, a case where a Si substrate was stacked as a thermoelectric layer, a Co$_2$MnGa thin film was stacked as a magnetic body layer, and a thermally oxidized SiO insulating film was stacked as an insulating layer is described, but the present invention is not limited thereto, and a thermoelectric material having a Seebeck effect can be used for the thermoelectric layer, a conductive ferromagnetic material can be used for the magnetic body layer, and an electrically insulating material having thermal conductivity can be used for the insulating layer.

INDUSTRIAL APPLICABILITY

The vertical thermoelectric conversion element of the present invention can be used for a device with thermoelectric power generation application or a heat flow sensor.

REFERENCE SIGNS LIST

10 Thermoelectric layer (Si substrate) (Seebeck thermoelectric material)
12 Low-temperature-side end portion
14 High-temperature-side end portion
20a, 20b Magnetic body (layer) (Co$_2$MnGa)
22 Low-temperature-side end portion
24 High-temperature-side end portion
26a, 26b Voltage output terminal
30 Insulating layer (SiO$_2$)
32 Insulating layer removing portion
40 Au electrode
42 High-temperature-side conductor line
44 Low-temperature-side conductor line
50 Load
52a, 52b Load conductor line

The invention claimed is:

1. A vertical thermoelectric conversion element comprising:
   a thermoelectric layer made of a thermoelectric material exhibiting a Seebeck effect, wherein one end portion of the thermoelectric layer is on a low temperature side, and the other end portion opposed to the low-temperature-side end portion is on a high temperature side;
   a magnetic body layer stacked on the thermoelectric layer, wherein the magnetic body layer has a magnetization component in a film thickness direction of the magnetic body layer, has conductivity, and generates a potential in a vector product direction of a temperature gradient direction and a magnetization direction of the magnetic body layer;
   a low-temperature-side conductor part connecting a low-temperature-side end portion of the thermoelectric layer and a low-temperature-side end portion of the magnetic body layer,
   a high-temperature-side conductor part connecting a high-temperature-side end portion of the thermoelectric layer and a high-temperature-side end portion of the magnetic body layer; and
   output terminals provided at both end portions of the magnetic body layer in the vector product direction, which are in the vector product direction of the temperature gradient direction of the thermoelectric layer and the magnetization direction of the magnetic body layer, for extracting a potential generated in the vector product direction.

2. The vertical thermoelectric conversion element according to claim 1, further comprising an electrically insulating layer having thermal conductivity provided in a stacking direction between the thermoelectric layer and the magnetic body layer.

3. The vertical thermoelectric conversion element according to claim 2, wherein the electrically insulating layer having thermal conductivity contains one kind or two or more kinds of an oxide selected from $SiO_2$ and $Al_2O_3$ and a nitride selected from AlN and BN.

4. The vertical thermoelectric conversion element according to claim 1, wherein the thermoelectric layer includes at least one kind of thermoelectric material selected from the group of thermoelectric materials including $Bi_2Te_3$, PbTe, Si, Ge, an Fe—Si alloy, a Cr—Si alloy, an Mg—Si alloy, a $CoSb_3$ alloy, an $Fe_2VAl$-based Heusler's alloy, and $SrTiO_3$.

5. The vertical thermoelectric conversion element according to claim 1, wherein the magnetic body layer is a magnetic body having conductivity and consists of a magnetic material having an anomalous Hall angle of 1% or more.

6. The vertical thermoelectric conversion element according to claim 5, wherein the magnetic material having an anomalous Hall angle of 1% or more consists of at least one kind of a magnetic material selected from the following groups (A) to (H):
- (A) at least one kind or two or more kinds of $L1_0$-type ordered alloys selected from the group consisting of FePt, CoPt, FePd, CoPd, FeNi, MnAl, and MnGa,
- (B) at least one kind or two or more kinds of Heusler's alloys selected from the group consisting of $Co_2MnGa$ and $Co_2MnAl$,
- (C) at least one kind or two or more kinds of $D0_{22}$-type ordered alloys selected from the group consisting of $Mn_3Ga$, $Mn_2FeGa$, $Mn_2CoGa$, and $Mn_2RuGa$,
- (D) at least one or two or more kinds of alloys selected from the group consisting of FeCr, FeAl, FeGa, FeSi, FeTa, FeIr, FePt, FeSn, FeSm, FeTb, CoFeB, CoTb, and NiPt,
- (E) at least one or two or more kinds of permanent magnet materials selected from the group consisting of an $SmCo_5$ magnet, an $Sm_2Co_{17}$ magnet, and an $Nd_2Fe_{14}B$ magnet;
- (F) at least one kind or two or more kinds of multilayer film materials selected from the group consisting of stacks of Co/Pt and Co/Pd;
- (G) at least one kind or two or more kinds of perovskite-type nitride materials selected from the group consisting of $Mn_4N$ and $Fe_4N$; and
- (H) at least one kind or two or more kinds of $D0_{19}$-type ordered alloys selected from the group consisting of $Mn_3Ga$, $Mn_3Ge$, and $Mn_3Sn$.

7. A device with thermoelectric power generation application or a heat flow sensor using the vertical thermoelectric conversion element according to claim 1.

* * * * *